United States Patent
Yasuda et al.

(10) Patent No.: US 10,335,918 B2
(45) Date of Patent: Jul. 2, 2019

(54) WORKPIECE PROCESSING APPARATUS

(71) Applicant: SHIN-ETSU HANDOTAI CO., LTD., Tokyo (JP)

(72) Inventors: Taichi Yasuda, Kita-ku (JP); Masanao Sasaki, Nishigo-mura (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 92 days.

(21) Appl. No.: 15/572,747

(22) PCT Filed: Mar. 25, 2016

(86) PCT No.: PCT/JP2016/001740
§ 371 (c)(1),
(2) Date: Nov. 8, 2017

(87) PCT Pub. No.: WO2016/199333
PCT Pub. Date: Dec. 15, 2016

(65) Prior Publication Data
US 2018/0117729 A1   May 3, 2018

(30) Foreign Application Priority Data
Jun. 12, 2015 (JP) .................................. 2015-119338

(51) Int. Cl.
*B24B 37/08* (2012.01)
*B24B 49/00* (2012.01)
(Continued)

(52) U.S. Cl.
CPC .............. *B24B 37/08* (2013.01); *B24B 37/28* (2013.01); *B24B 49/00* (2013.01); *B24B 53/017* (2013.01); *H01L 21/304* (2013.01)

(58) Field of Classification Search
CPC ......... B24B 37/08; B24B 37/28; B24B 49/00; B24B 53/017; H01L 21/304
(Continued)

(56) References Cited

U.S. PATENT DOCUMENTS 7,507,143 B2 * 3/2009 Yamada .................... B24B 7/17
451/10
2008/0233840 A1 * 9/2008 Pietsch .................. B24B 37/08
451/41

FOREIGN PATENT DOCUMENTS

JP  S59-46667 U   3/1984
JP  H10-230452 A  9/1998
JP  2001-38603 A  2/2001

OTHER PUBLICATIONS

Jun. 14, 2016 Search Report issued in International Patent Application No. PCT/JP2016/001740.

* cited by examiner

*Primary Examiner* — Robert A Rose
(74) *Attorney, Agent, or Firm* — Oliff PLC (57) ABSTRACT

A workpiece processing apparatus including: a center drum that is rotatable around a rotation axis and has at least one first groove formed in the axial direction on the peripheral surface, a carrier having a holding hole to insert and hold a workpiece to be processed, an upper and lower turn table that are rotatable around the rotation axis in a state wherein the carrier holding workpiece is interposed, at least one hook fitted in the upper turn table's internal circumference, with the tip being inserted into the first groove and movable along first groove; wherein the center drum has at least one second groove formed in the axial direction on peripheral surface, and second groove has a length different from that of the first groove and has a supporting surface to support the hook
(Continued)

from below at a position above a position where upper turn table processes the workpiece.

12 Claims, 5 Drawing Sheets

(51) Int. Cl.
    *B24B 37/28*     (2012.01)
    *B24B 53/017*     (2012.01)
    *H01L 21/304*     (2006.01)

(58) Field of Classification Search
    USPC .................. 451/262, 268, 269, 41, 56, 72
    See application file for complete search history.

WORKPIECE PROCESSING APPARATUS

TECHNICAL FIELD

The present invention relates to a workplace processing apparatus by which a sheet workplace such as a silicon wafer is inserted and held in the holding hole of the carrier and both surfaces of the workpiece are processed at the same time, including a double-side polishing apparatus and a double-side lapping apparatus.

BACKGROUND ART

In flattening a sheet workpiece such as a silicon wafer, double-side polishing apparatuses and double-side lapping apparatuses have been used previously.

In the double-side polishing apparatus, for example, a discoid carrier with a planetary gear at the periphery is disposed between upper and lower turn tables each pasted with a polishing pad made of urethane foam or non-woven fabric. This carrier is made to rotate and revolve around a sun gear by mutually rotating the sun gear and an internal gear, which engage with the planetary gear, while the carrier holding a workpiece in its holding hole. The rotation and revolution of carrier and rotations of the upper and lower turn tables make the workpiece rub with the upper and lower turn tables to polish the upper and lower surfaces of the workpiece at the same time. During the polishing, polishing slurry is supplied from a plurality of holes provided in the upper turn table to perform polishing efficiently.

The upper turn table is provided with an up-and-down motion mechanism, which allows the upper turn table to move upward and downward, (e.g., Patent Document 1). While the upper turn table is at the raised position where it has been moved upward, the carrier is disposed on the lower turn table, and a workpiece is held by the carrier. The upper turn table may also be moved downward from the raised position to a position of intermediate height, where the downward movement of the upper turn table is stopped, to give appropriate gap between the upper turn table and the lower turn table, and a cleaning nozzle is inserted between the upper turn table and the lower turn table to clean the polishing surfaces of the polishing pads. In the position of intermediate height, the polishing surfaces of the polishing pads may be subjected to dressing by inserting a dresser head between the upper turn table and the lower turn table to regulate the surface condition of the polishing pads.

In such cleaning and dressing of the polishing surface of the polishing pad, the cleaning nozzles and the dresser head each frequently have an area that is apparently smaller than that of the polishing surface of the polishing pad pasted on the turn table. Such a head is attached to an arm, and this arm can move the head from the outermost periphery of the turn table to the innermost circumference by the linear motion or rotating movement thereof. This motion, together with simultaneous rotation of the upper and lower turn tables, allow these heads to clean or dress the whole polishing surface.

With high integration of semiconductor devices in recent years, silicon wafers have been more strictly required to have flatness and surface quality. To fulfill such requirements for the quality, it is important to maintain the polishing surface of a double-side polishing apparatus and a double-side lapping apparatus at an appropriate condition continually.

In actual processes, however, the operation may be followed by residual substances remained on the polishing surface in lapping, for example, which obstruct the flow of slurry; clogging of the surface of the polishing pad in double-side polishing, for example; as well as degradation and deformation of the surface resin of the polishing pad itself. These changes of the process conditions cause to induce degradation and fluctuation of wafer quality.

To prevent such degradation and fluctuation of wafer quality, it is important to maintain the polishing surface in uniform and good condition. Accordingly, it is usual to regularly perform cleaning of the polishing surface and dressing of the polishing pad described in background art.

The apparatuses, however, have been becoming larger due to an increase of wafer diameter, which makes it more difficult to maintain the polishing surface with large area uniformly.

In many cases, the upper turn table of a double-side polishing apparatus or a double-side lapping apparatus is connected to a cylinder shaft provided at the upper part of the apparatus through a universal joint or a spherical bearing so as to change the angle optionally. This intends to perform polishing of a workpiece, in which uniform loading can be applied continually from the upper turn table when, the workpiece or the carrier holding the workpiece has in thickness variation.

CITATION LIST

Patent Literature

Patent Document 1: Japanese Unexamined Patent Application Publication (Kokai) No. H10-230452

SUMMARY OF INVENTION

Technical Problem

The upper turn table with this mechanism, however, is unstable in tilt when the upper turn table is stopped at the position of intermediate height due to this movable universal joint or the spherical bearing. The upper turn table is liable to alter the tilt by slight force applied from the outside. This alteration of tilt means that the gap between the upper turn table and the lower turn table differs depending on time and spots.

Accordingly, the gap between the upper turn table and the lower turn table is fluctuated when a cleaning or dresser head is inserted into the foregoing gap for cleaning or dressing the polishing surface of the polishing pad, and the effects of cleaning or dressing the polishing surface differ from spots to spots, thereby failing to obtain uniform state of the polishing surface.

The present invention was accomplished in view of the above-described problems. It is an object of the present invention to provide a workplace processing apparatus that can keep the upper turn table horizontally under the influence of force in the vertical direction to the polishing surface of the upper turn table when the upper turn table is stopped at a position above a position where the workpiece is processed.

Solution to Problem

To solve the problems described above, the present invention provides a workpiece processing apparatus comprising:

a center drum that is rotatable around a rotation axis and. has at least one first groove on the peripheral surface, each first, groove being formed in the axial a carrier having a holding hole to insert and hold a workpiece to be processed;

an upper turn table and a lower turn table that are rotatable around the rotation axis in a state in which the carrier holding the workpiece is interposed;

at least one hook, each hook being fitted in the internal circumference of the upper turn table, with the tip of each hook being inserted into the first groove and movable along the first groove; wherein the center drum has at least one second groove on the peripheral surface, each second groove being formed in the axial direction; and the second groove has a length different from that of the first groove and has a supporting surface to support the hook from, below at a position above a position where the upper turn table processes the workpiece.

In such an apparatus, the supporting surface (s) of the second groove(s) support(s) the hook(s); which enables the upper turn table to be kept horizontally under the influence of force in the vertical direction to the polishing surface of the upper turn table when the upper turn table is stopped at a position above a position where the workpiece is processed. This makes it possible to uniformly perform cleaning and dressing of the polishing pads pasted on the upper and lower turn tables while keeping the upper turn table horizontally.

It is preferable that the supporting surface of the second groove have a surface area to support at least the whole load of the upper turn table through the hook.

In such an apparatus, the whole load of the upper turn table can be supported by the supporting surface through the hook, which enables the upper turn, table to be kept horizontally under the influence of force in the vertical direction to the polishing surface of the upper It is preferable that the at least one hook, the at least one first groove, and the at least one second groove each form a pair, being arranged in angular intervals of 180° in the corresponding pair.

In such an apparatus, the upper turn table can be supported stably by the supporting surface through the hook.

It is preferable that the pair of the at least one first groove and the pair of the at least one second groove be arranged on the center drum in angular intervals of 90°.

In such an apparatus, the first groove and the second groove can be switched conveniently.

The workpiece processing apparatus can be a double-side polishing apparatus or a double-side lapping apparatus.

Such an apparatus can be favorably applied to a production process of a workpiece such as a silicon wafer that is required to have particularly high flatness.

ADVANTAGEOUS EFFECTS OF INVENTION

In the inventive workpiece processing apparatus, the upper turn table can be kept horizontally while being stopped at a position, above a position where the workpiece is processed, even when the upper turn table rotates, or the upper turn table is influenced by force in the vertical direction to the polishing surface thereof. Accordingly, treatments such as dressing of the polishing pad of the upper turn table can be operated uniformly, which enables the processing of a workpiece to give high quality.

DESCRIPTION OF EMBODIMENTS

Hereinafter, the embodiments of the present invention will be described, but the present invention is not limited thereto.

As described above, the upper turn table cannot be kept horizontally under the influence of force in the vertical direction to the polishing surface of the upper turn table when the upper turn table is stopped at a position above a position where a workpiece is processed.

The present inventors have diligently investigated to solve the forgoing problem. As a result, the inventors have found a center drum having at least one first groove formed in the axial direction on the peripheral surface, further comprising at least one second groove formed in the axial direction on the peripheral surface, with the second groove having a length different from that of the first groove and having a supporting surface to support a hook fitted in the internal circumference of the upper turn table from below and at a position above a position where the upper turn table processes the workpiece.

The inventors have found that the second groove to support the hook makes it possible to keep the upper turn table horizontally under the influence of force in the vertical direction to the polishing surface of the upper turn table when the upper turn table is stopped at a position above a position where the workpiece is processed, The inventors have investigated the best mode for carrying out these, thereby completing the present invention.

The inventive workpiece processing apparatus will be described specifically. Illustrative examples of the inventive workpiece processing apparatus include a double-side polishing apparatus and a double-side lapping apparatus.

Such an apparatus can be favorably applied to a production process of a workpiece such as a silicon wafer that is required to have particularly high flatness.

Hereinafter, the inventive workpiece processing apparatus will be described by illustrating a double-side polishing apparatus.

Figure 1:
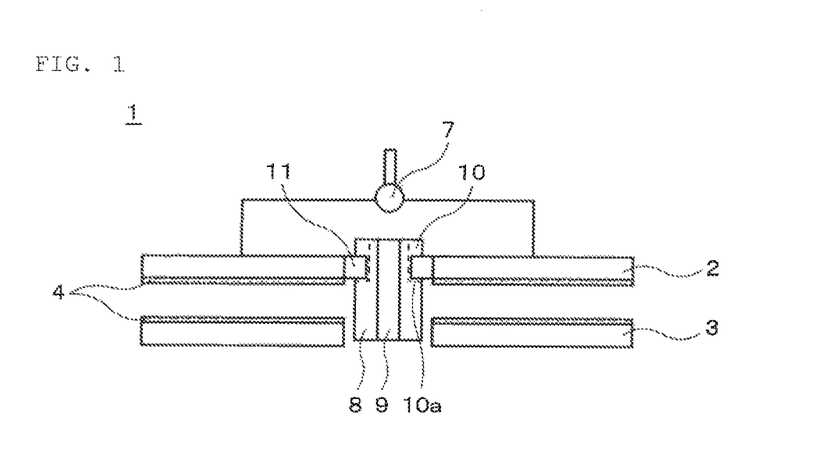
FIG. 1 is a schematic view showing a double-side polishing apparatus as an example of the inventive workpiece processing apparatus.

As shown in FIG. 1, the inventive double-side polishing apparatus 1 is equipped with the upper turn table 2 and the lower turn table 3 that are provided upward and downward facing with each other. Each of the upper turn table 2 and the lower turn table 3 is pasted with the polishing pad A. Between the upper turn table 2 and the lower turn table 3, a sun gear (not shown in FIG.) is provided at the central part, and an internal gear (not shown in FIG.) is provided at the peripheral part.

Figure 2:
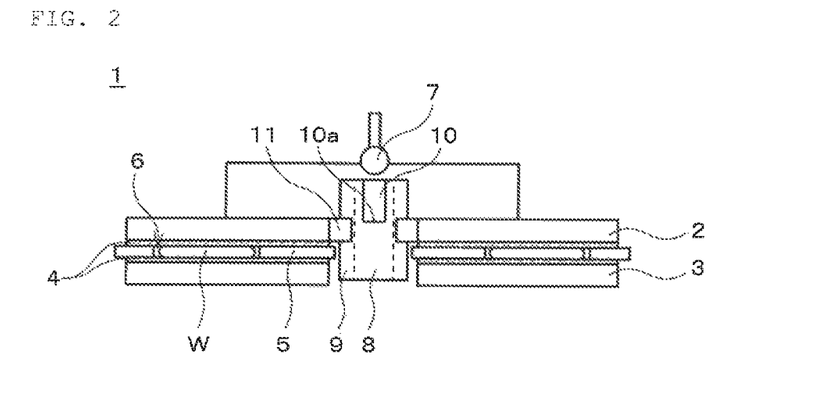
FIG. 2 is a schematic view showing a state in which the upper turn table is moved downward to a position where a workpiece is processed in the inventive double-side polishing apparatus.

As shown in FIG. 2, the carrier 5 is provided with the holding hole 6 to hold the workpiece W. In double-side polishing, the carrier 5 is disposed between the upper turn table 2 and the lower turn table 3 with the workpiece W being held in the holding hole 6.

The upper turn table 2 is connected to a cylinder shaft (not shown in FIG.) provided to the upper part of the apparatus through the universal joint 7 or a spherical bearing so as to change the angle optionally. This enables to apply uniform loading from the upper turn table 2 continually in polishing even when the workpiece W or the carrier 5 holding the workpiece W has variation in thickness. In this embodiment, the universal joint 7 is used.

The center drum 8 is rotatable around the rotation axis. The center drum 8 has at least one first groove 9 formed in the axial direction on the peripheral surface.

The upper turn table 2 has at least one hook 11 fitted in the internal circumference thereof. Each hook 11, the tip of which is inserted into the first groove 9, is movable along the first groove 9.

When the upper turn table 2 is moved downward to a position where the workpiece W is processed, the hook 11 fitted to the upper turn table 2 is inserted into the first groove 9 provided on the center drum 8 and is fitted thereto. This situation makes it possible to transmit the driving rotation force of the center drum 8 to the upper turn table 2 to rotate the upper turn table 2.

The both sides of the workpiece W can be polished simultaneously by rotating and revolving the carrier 5 holding the workpiece W, with the upper and lower polishing pads 4 being pressed to the both of front and back sides of the workpiece W, while rotating each of the upper turn table 2 and the lower turn table 3 around the rotation axis.

The center drum 8 is further provided with at least one second groove 10 formed in the axial direction on the peripheral surface. The second groove 10 has a length different from that of the first groove 9 and has a supporting surface 10a to support the hook 11 from below at a position above a position where the upper turn table 2 processes the workpiece W.

Figure 3:
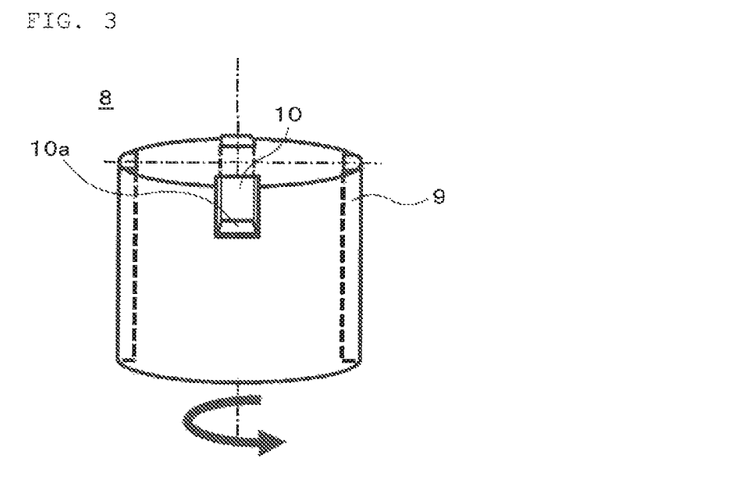
FIG. 3 is a schematic view showing an example of the center drum in the inventive, double-side polishing apparatus.
Figure 4:
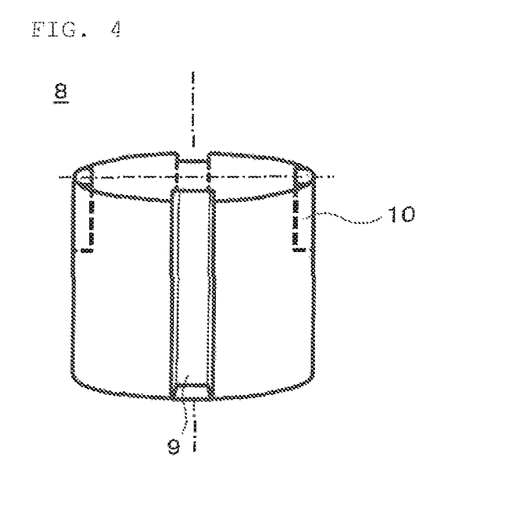
FIG. 4 is a schematic view in which the center drum is rotated by 90° in the axial direction in the inventive double-side polishing apparatus shown in FIG. 3.

As shown in FIGS. 3 and 4, the length of the second groove 10 is shorter than that of the first groove 9. On the other hand, the first groove 9 has a sufficient length to bring the upper turn table 2 into contact with the workpiece W, carrier 5, or the lower turn table 3.

When the upper turn table 2 is moved downward, with the hook 11 being inserted to the second groove 10 and fitted thereto, the hook 11 comes into contact with the supporting surface 10a at the lower end of the second groove 10, which stops the upper turn table 2 from moving downward.

Accordingly, the upper turn table 2 stops at the position of intermediate height where the hook 11 has come to be in contact with the supporting surface 10a. While in this position of intermediate height, cleaning and dressing can be performed on the polishing surfaces of the upper and lower turn tables 2 and 3.

The length of the second groove 10 is preferably adjusted to allow the upper turn table 2 to stop from moving downward at the desired position of intermediate height.

As shown in FIG. 3, the supporting surface 10a of the second groove 10 preferably has a surface area that can support at least the whole load of the upper turn table 2 through the hook 11.

In such an apparatus, the whole load of the upper turn table 2 can be supported by the supporting surface through the hook 11, which enables the upper turn table 2 to be kept horizontally under the influence of force in the vertical direction to the polishing surface of the upper turn table 2.

The second groove 10 can be a notch form with the supporting surface 10a in a planar shape, for example, but not limited thereto.

Each of the hooks 11, the first grooves 9, and the second grooves 10 preferably form a pair and are arranged in angular intervals of 180° in the corresponding pair.

In such an apparatus, the upper turn table 2 can be supported by the supporting surfaces 10a of the two second grooves 10 facing with each other at 180°, through the hooks 11. The load of the upper turn table 2 stopped at the position of intermediate height is totally or partly supported by the two points as described above. Accordingly, the upper turn table 2 can foe supported stably, and the position in height where the upper turn table 2 is stopped and the tilt thereof can be kept with remarkably improved stability.

In this case, a pair of the first grooves 9 and a pair of the second grooves 10 are preferably arranged on the center drum 8 in angular intervals of 90° as shown in FIG. 3 and FIG. 4.

In such an apparatus, the first groove 9 and the second groove 10 can be switched conveniently.

In switching from the first grooves 9 to the second grooves 10, for example, the upper turn table 2 is moved upward in the first place, and the hooks 11 are pulled out from the first grooves 9 entirely. At this stage, the hooks 11 remain at the unchanged positions since the upper turn table 2 does not rotate. The center drum 8 is rotated by 90° in this situation, and then the upper turn table 2 is moved downward to insert the hooks 11 to the second grooves 10. In this way, the switching from the first grooves 9 to the second grooves 10 can be performed.

In the foregoing embodiment, two sets of the first groove 9 and the second groove 10, forming a total of four grooves with two kinds of length, are disposed on the center drum 8 in angular intervals of 90°. It is also possible, however, to dispose a total of six grooves including each three numbers of the first grooves 9 and the second grooves 10 in angular intervals of 60°. This makes it possible to further improve the stability in keeping the height and the tilt of the turn table 2 when the upper turn table 2 is stopped at the position of intermediate height. When two kinds of the second grooves 10 are provided, it is possible to stop the turn table 2 at two positions of intermediate height.

In such a double-side polishing apparatus of the present invention, the upper turn table can be kept horizontally while being stopped at a position above a position where the workpiece is processed, even when the upper turn table rotates, or the upper turn table is influenced by force in the vertical direction to the polishing surface thereof. This makes it possible to perform uniform cleaning and dressing of the polishing pads pasted on the upper and lower turn tables while keeping the upper turn table horizontally. Accordingly, high quality polishing of a workpiece can be performed by using a double-side polishing apparatus in which the dressing and cleaning have been performed uniformly as described above.

The inventive workpiece processing apparatus has been described by illustrating a double-side polishing apparatus, but the inventive apparatus can be applied to a double-side lapping apparatus to achieve the same effects described above.

EXAMPLE

Hereinafter, the present invention will be described more specifically by showing Examples and Comparative Examples, but the present invention is not limited, thereto.

Example 1

The inventive double-side polishing apparatus 1 shown in FIG. 1 was employed to examine the stability of the upper turn table 2 subjected to force in the vertical direction to the polishing surface of the upper turn table 2 when the upper turn table 2 was stopped at the position of intermediate height.

Figure 5:
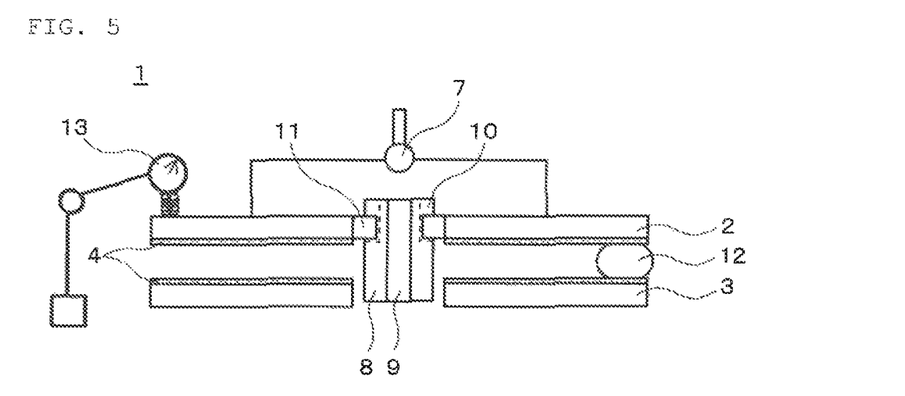
FIG. 5 is a schematic view showing a method, for applying force in a vertical direction to the polishing surface of the upper turn table by using an air bag in Example 1.

The upper turn table 2 was stopped at the position of intermediate height, and the air bag 12 was inserted between the upper turn table 2 and the lower turn table 3 as described in FIG. 5. Then, the pressure of the air bag 12 was increased to increase the force for pushing the upper turn table 2 up.

Figure 6:
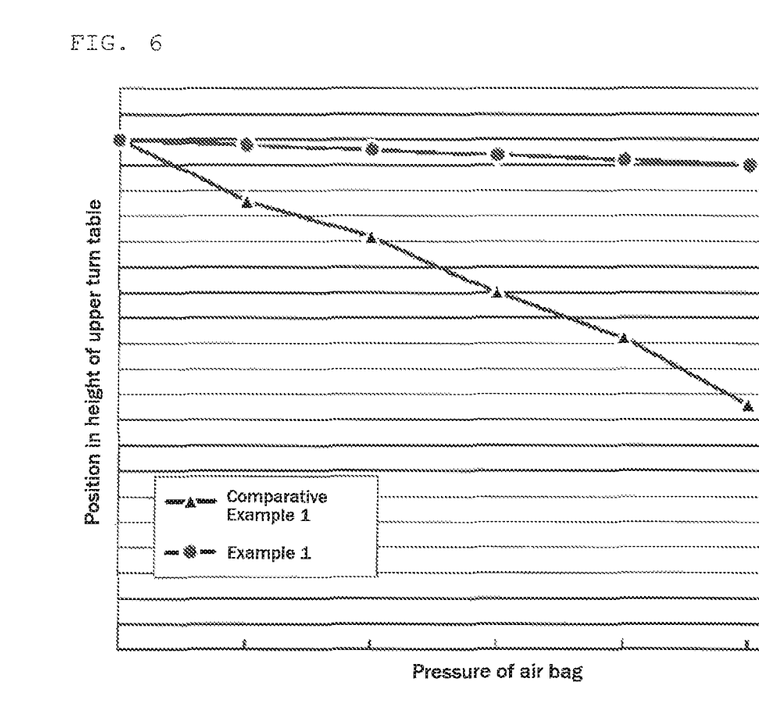
FIG. 6 is a graph showing changes of the position in height of the upper turn table when applying force in a vertical direction to the polishing surface of the upper turn table by using an air bag in Example 1 and Comparative Example 1.

In this stage, the changes of position of the upper turn table 2 in height was monitored with the dial gauge 13 at the side of the upper turn table 2 opposite to the place where the air bag 12 had been inserted. In other words, the position of the upper turn table 2 in height should be lowered at the opposite side if the upper turn table 2 is tilted by the pressure of the air bag 12. The measured results with the dial gauge 13 are shown in FIG. 6. FIG. 6 also shows the results of Comparative Example 1 that will be described later.

As the result, Example 1, in which the load of the upper turn table was supported by the bottoms of the shorter grooves, could decrease the changes of height of the upper turn table at the side opposite to the air bag to about 1/10 compared to Comparative Example 1 as shown in FIG. 6.

Since the hooks 11 were in contact with the supporting surfaces 10a of the second grooves 10 to support the upper turn table 2 by the supporting surfaces 10a as shown in FIG. 5, the upper turn table 2 would not tilt even when trying to push the upper turn table 2 up by using the air bag 12. As a result, the height of the upper turn table 2 measured at the opposite side hardly changed.

Comparative Example 1

Figure 7:
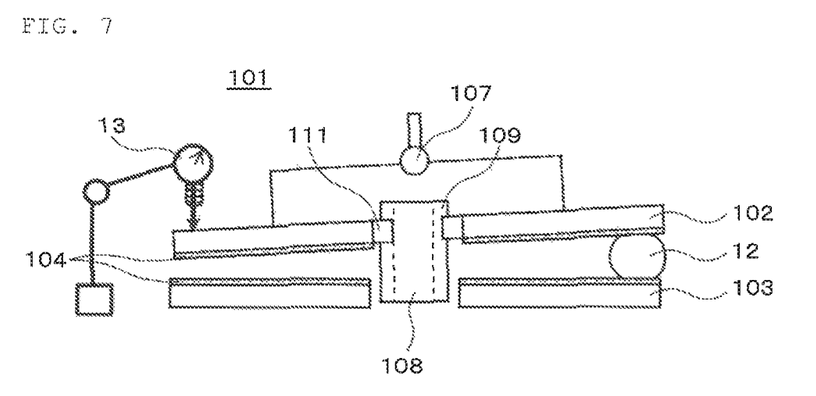
FIG. 7 is a schematic view showing a method for applying force in a vertical direction to the polishing surface of the upper turn table by using an air bag in Comparative Example 1.

As shown in FIG. 7, the double-side polishing apparatus 101 was equipped with the upper turn table 102 and the lower turn table 103 that are provided upward and downward facing with each other, and each of the turn tables 102 and 103 was pasted with the polishing pad 104. The upper turn table 102 was joined to the universal joint 107 so as to change the angle optionally.

The hooks 111 provided to the upper turn table 102 were inserted to the first grooves 109 provided to the center drum 103. The upper turn table 102 was moved downward and stopped at the position of intermediate height. Then, the air bag 12 was inserted between the upper turn table 102 and the lower turn table 103. The pressure of the air bag 12 was increased to perform the same measurement as in Example 1. The results are shown in FIG. 6 as described above.

As the result, Comparative Example 1 showed greater fluctuation of the position in height of the upper turn table 102 at the side opposite to the air bag 12 compared to Example 1 by about 10 times as shown in FIG. 6.

When dressing was performed while stopping the upper turn table 2 that had been moved downward to the position of intermediate height, the dresser head was pressed to the polishing surface. In other words, a part of the upper turn table was pushed upward by the dresser head and moved upward when the dressing was performed at the position of intermediate height by using the first groove 9 as can be seen from the results of Comparative Example 1. This caused to lower the pressure for pressing, thereby failing to obtain sufficient dressing effect.

On the other hand, when the dressing was performed at the position of intermediate height by using the second groove(s) 10, the tilt of the upper turn table 2 hardly changed as can be seen, from the results of Example 1, indicating that dressing could be performed under a desired pressure.

Example 2

Figure 8:
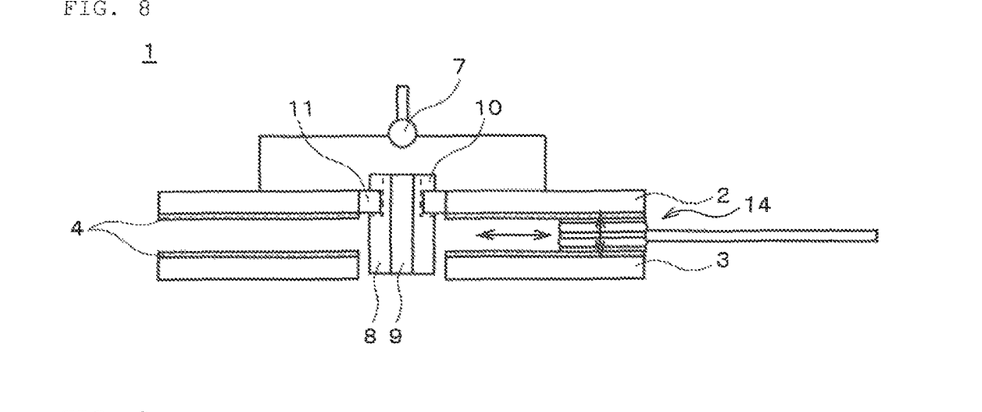
FIG. 8 is a schematic view showing a manner of dressing polishing pads pasted on the upper and lower turn tables in Example 2.

The workpiece W was subjected to double-side polishing, with the hooks 11 being inserted to the first grooves 9 as shown in FIG. 2. Then, the workpiece W was taken up, and cleaning and dressing were performed on the polishing surface of the polishing pads 4 pasted on the upper and lower turn tables 2 and 3. The dressing was performed as shown in FIG. 8, with the hooks being inserted to the second grooves 10, and the dresser head 14 being inserted between the upper turn table 2 and the lower turn table 3.

Figure 9:
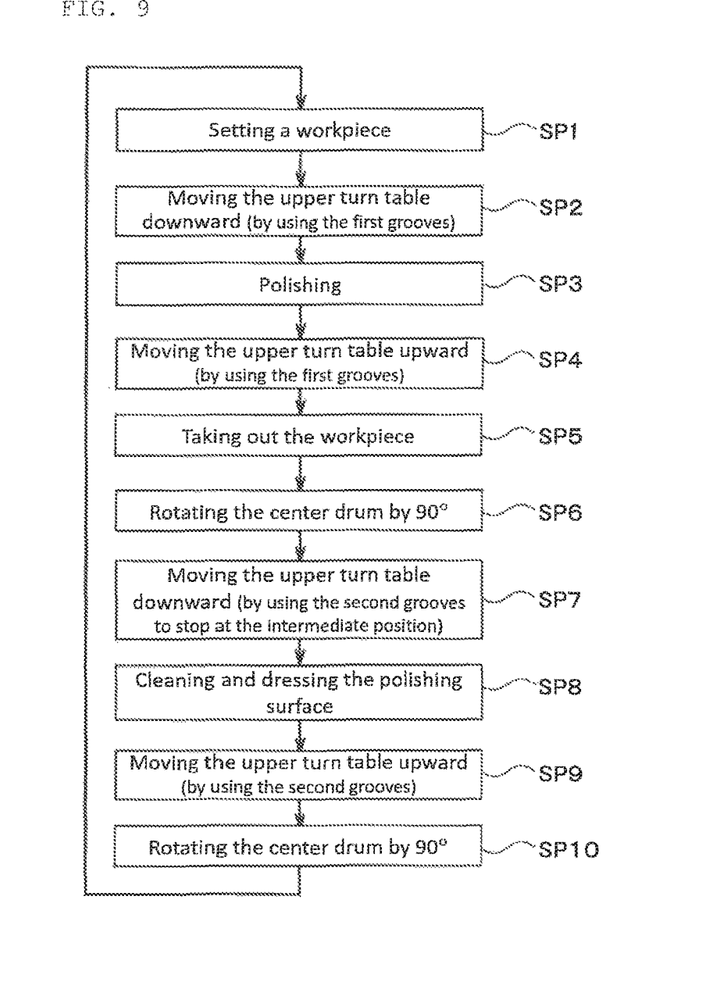
FIG. 9 is a process diagram showing a process to perform double-side polishing as well as cleaning and dressing of the polishing surface in Example 2.

Specifically, the following order was performed according to the process diagram shown in FIG. 9: setting a workpiece (SP1), moving the upper turn table downward (by using longer grooves) (SP2), polishing (SP3), moving the upper turn table upward (SP4), taking out the workpiece (SP5), rotating the center drum by 90° (SP6), moving the upper turn table downward (by using shorter grooves to stop at the intermediate position) (SP7), cleaning and dressing the polishing surface (SP3), moving the upper turn table upward (SP9), and rotating the center drum by 90° (SP10). This was continued to 30 batches, with the order being returned to SP1 from SP10.

In SP4 and SP9 for moving the upper turn table upward, the hooks 11 were entirely pulled out from the first grooves 9 or the second grooves 10. At this stage, the hooks 11 remained at the unchanged positions since the upper turn table 2 did not rotate. In this situation, the center drum 8 was rotated by 90° in each of SP6 and SP10. Then, the upper turn table 2 was moved downward in SP7 or SP2 to switch the grooves where the hooks 11 were inserted.

Figure 10:
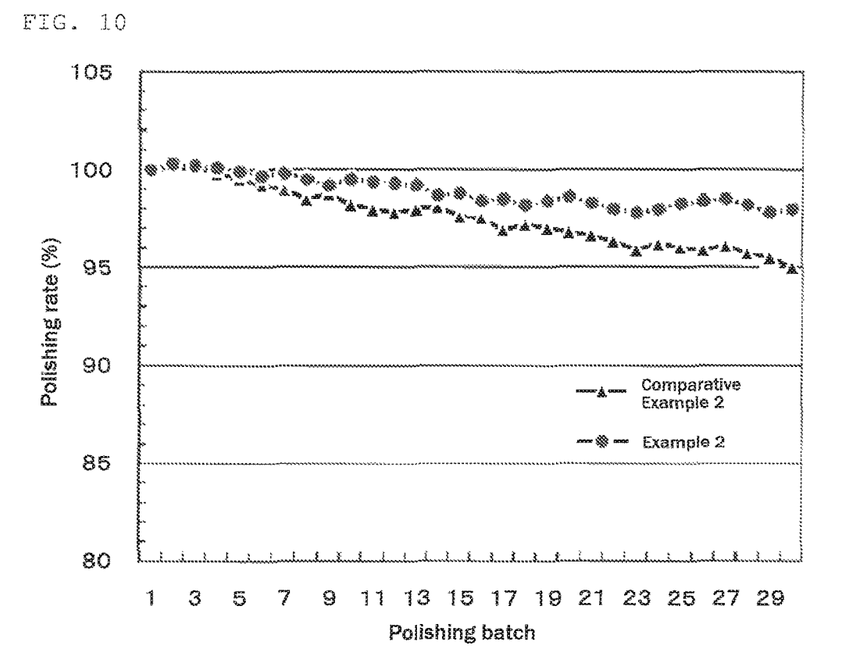
FIG. 10 is a graph showing relations between the polishing rate and batches in Example 2 and Comparative Example 2.

The relations between the batch numbers and the polishing rate are shown in FIG. 10. FIG. 10 also shows the results of Comparative Example 2 that will be described later. As the flatness of the double-side polished workpiece W, GBIR (Global Backsurface-referenced Ideal plane/Range) and SFQRmax (Site Frontsurface referenced least sQuares/Range) were measured.

As a result, the polishing rate after 30 batches in Example 2 was lowered from the polishing rate immediately after stating the continuous polishing, being defined as 100, by the rate of only about 2% as shown in FIG. 10. In Example 2, GBIR and SFQRmax, which show flatness of the workpiece after the double-side polishing, were improved by 4.2% and 6.0% respectively compared to those of Comparative Example 2.

Comparative Example 2

Figure 11:
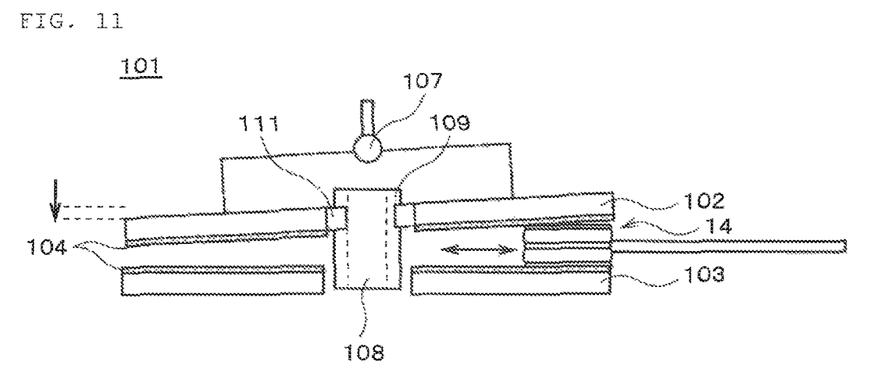
FIG. 11 is a schematic view showing a manner of dressing polishing pads pasted on the upper and lower turn tables in Comparative Example 2.

Double-side polishing of the workpiece W was repeated, together with cleaning and dressing of the polishing surface of the polishing pad 104, as in Example 2 except that the double-side polishing apparatus 101 shown in FIG. 11 was used, and the dressing was performed at the position of intermediate height by using the first grooves 109. That is, SP6 and SP10 in FIG. 9 were not performed.

The relations between the batch numbers and the polishing rate were measured as in Example 2 and shown in FIG. 10 as described above. As the flatness of the double-side polished workpiece W, GBIR and SFQRmax were measured.

As a result, the polishing rate in Comparative Example 2 showed lowering of about 5% after 30 batches as shown in FIG. 10. In Comparative Example 2, GBIR and SFQRmax of the workpiece after the double-side polishing, were worsened by 4.2% and 6.0% respectively compared to those of Example 2.

As described above, it was found that cleaning and dressing could be performed while stabilizing the height and tilt of the upper turn table by changing the center drum to have the first, groove and the second groove with different types of groove, and adding processes of SP6 and SP10 only.

It is to be noted that the present invention is not limited to the foregoing embodiment. The embodiment is just an exemplification, and any examples that have substantially the same feature and demonstrate the same functions and effects as those in the technical concept described in claims of the present invention are included in the technical scope of the present invention.

The invention claimed is:

1. A workpiece processing apparatus comprising:
a center drum that is rotatable around a rotation axis and has at least one first groove on the peripheral surface, each first groove being formed in the axial direction;
a carrier having a holding hole to insert and hold a workpiece to be processed;
an upper turn table and a lower turn table that are rotatable around the rotation axis in a state in which the carrier holding the workpiece is interposed;
at least one hook, each hook being fitted in the internal circumference of the upper turn table, with the tip of each hook being inserted into the first groove and movable along the first groove; wherein
the center drum has at least one second groove on the peripheral surface, each second groove being formed in the axial direction; and
the second groove has a length different from that of the first groove and has a supporting surface to support the hook from below at a position above a position where the upper turn table processes the workpiece.

2. The workpiece processing apparatus according to claim 1, wherein the supporting surface of the second groove has a surface area to support at least the whole load of the upper turn table through the hook.

3. The workpiece processing apparatus according to claim 1, wherein the at least one hook, the at least one first groove, and the at least one second groove each form a pair, being arranged in angular intervals of 180° in the corresponding pair.

4. The workpiece processing apparatus according to claim 2, wherein the at least one hook, the at least one first groove, and the at least one second groove each form a pair, being arranged in angular intervals of 180° in the corresponding pair.

5. The workpiece processing apparatus according to claim 3, wherein the pair of the at least one first groove and the pair of the at least one second groove are arranged on the center drum in angular intervals of 90°.

6. The workpiece processing apparatus according to claim 4, wherein the pair of the at least one first groove and the pair of the at least one second groove are arranged on the center drum in angular intervals of 90°.

7. The workpiece processing apparatus according to claim 1, wherein the workpiece processing apparatus is a double-side polishing apparatus or a double-side lapping apparatus.

8. The workpiece processing apparatus according to claim 2, wherein the workpiece processing apparatus is a double-side polishing apparatus or a double-side lapping apparatus.

9. The workpiece processing apparatus according to claim 3, wherein the workpiece processing apparatus is a double-side polishing apparatus or a double-side lapping apparatus.

10. The workpiece processing apparatus according to claim 4, wherein the workpiece processing apparatus is a double-side polishing apparatus or a double-side lapping apparatus.

11. The workpiece processing apparatus according to claim 5, wherein the workpiece processing apparatus is a double-side polishing apparatus or a double-side lapping apparatus.

12. The workpiece processing apparatus according to claim 6, wherein the workpiece processing apparatus is a double-side polishing apparatus or a double-side lapping apparatus.

* * * * *